(12) United States Patent
Yeh

(10) Patent No.: US 8,894,249 B2
(45) Date of Patent: Nov. 25, 2014

(54) LED MODULE AND METHOD OF BONDING THEREOF

(71) Applicant: TSMC Solid State Lighting Ltd., Hsinchu (TW)

(72) Inventor: Wei-Yu Yeh, Tainan (TW)

(73) Assignee: TSMC Solid State Lighting Ltd., Hsin Chu (TW)

( * ) Notice: Subject to any disclaimer, the term of this patent is extended or adjusted under 35 U.S.C. 154(b) by 0 days.

(21) Appl. No.: 14/153,347

(22) Filed: Jan. 13, 2014

(65) Prior Publication Data

US 2014/0112009 A1 Apr. 24, 2014

Related U.S. Application Data

(63) Continuation of application No. 13/286,562, filed on Nov. 1, 2011, now Pat. No. 8,632,221.

(51) Int. Cl.
*F21V 29/00* (2006.01)
*H05K 3/00* (2006.01)
*H05K 1/02* (2006.01)
*H05K 1/05* (2006.01)

(52) U.S. Cl.
CPC ........ *F21V 29/22* (2013.01); *H05K 2203/0285* (2013.01); *H05K 1/0203* (2013.01); *H05K 3/0061* (2013.01); *H05K 1/05* (2013.01); *H05K 2201/10106* (2013.01)
USPC ......................... 362/294; 257/712; 228/110.1

(58) Field of Classification Search
USPC ......................... 362/294; 228/110.1; 257/712
See application file for complete search history.

(56) References Cited

U.S. PATENT DOCUMENTS

| 7,287,879 | B2 * | 10/2007 | Hsu ................................. 362/294 |
| 7,300,182 | B2 * | 11/2007 | Mazzochette ................. 362/294 |
| 7,311,431 | B2 * | 12/2007 | Chew et al. ................... 362/613 |
| 7,677,899 | B2 * | 3/2010 | Low ............................... 439/56 |
| 2008/0019103 | A1 | 1/2008 | Kim |
| 2010/0181891 | A1 | 7/2010 | Lee et al. |

OTHER PUBLICATIONS

Hung-Pin Chang, Yung-Chi Lin, Chia-Lin Yu, Jui-Ping Hung, Chien Ling Hwang and Chen-Hua Yu; "Thermally Efficient Packaging for a Photonic Device;" U.S. Appl. No. 12/884,570, filed Sep. 17, 2010; 28 pages.

* cited by examiner

*Primary Examiner* — Ali Alavi
(74) *Attorney, Agent, or Firm* — Haynes and Boone, LLP

(57) ABSTRACT

The present disclosure provides a method including providing a light-emitting diode (LED) device (e.g., a LED element and PCB) and a heat sink. The LED device is bonded to the heat sink by applying an ultrasonic energy. In an embodiment, the bonding may form a bond comprising copper and aluminum. The PCB may be a metal core PCB (MC-PCB).

20 Claims, 6 Drawing Sheets

US 8,894,249 B2

LED MODULE AND METHOD OF BONDING THEREOF

PRIORITY DATA

The present application is a continuation application of U.S. patent application Ser. No. 13/286,562, filed on Nov. 1, 2011, entitled "LED Module and Method of Bonding Thereof", the disclosure of which is hereby incorporated by reference in its entirety.

BACKGROUND

The present disclosure relates generally to assembly, and more particularly, to assembly of light-emitting diode (LED) devices.

Photonic devices such as LED devices are semiconductor light sources used in diverse applications. LED devices emit light of various wavelengths when a voltage is applied. Their compact size, switching speed and reliability have provided the industry with rapid growth. Because an LED generates heat, it is typically in need of a cooling device for releasing the generated heat. One such cooling device is a heat sink. However, traditional LED assembly methods often include costly and complicated processes to attach the LED and cooling device, for example, requiring high temperature eutectic bonding. Other drawbacks of current technologies include the lack of thermal conductivity between the LED and a cooling device. Thus, while existing methods of assembling and applying LED devices have in some respects been adequate for their intended purpose, they have not been entirely satisfactory.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. Although this various embodiments are described as including LED elements or devices, one of ordinary skill in the art would recognize that aspects of the present disclosure are applicable to other device types including other photonic devices.

Figure 1:
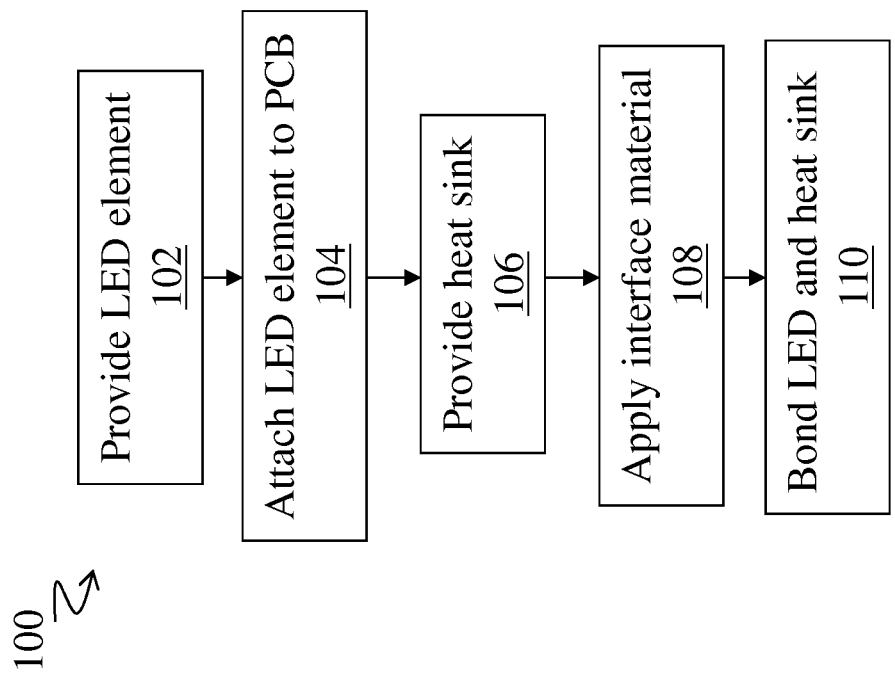
FIG. 1 is a flow chart of a method of assembling an LED device according to one or more aspects of the present disclosure.

Illustrated in FIG. 1 is a flowchart of a method 100 for assembling a photonic (e.g., LED) device in accordance with various aspects of the present disclosure. FIGS. 3-4 and 5-6 are cross-sectional views of the assembly of various embodiments during stages of the method 100. FIG. 4 provides a corresponding top view. It is understood that various aspects of the Figures have been simplified for ease of understanding of the inventive concepts discussed herein. Accordingly, it should be noted that additional processes may be provided before, during, and/or after the method 100 of FIG. 1, and moreover, some processes are only briefly described herein. Similarly, the devices of FIGS. 2-6 may include additional elements not specifically illustrated and/or may illustrate elements that are omitted in other embodiments.

Referring to FIG. 1, the method 100 begins at block 102 where one or more LED elements (or devices) are provided. The LED element may include semiconductor material suitably doped to provide a p-n junction. The LED element may include any wavelength of emitted radiation (e.g., visible light, ultraviolet, or infrared) now known or later developed. Referring to the example of FIG. 2, an LED element 202 is illustrated.

The method 100 then continues to block 104 where an LED element is connected (e.g., bonded) to a printed circuit board (PCB) to form an LED device. The LED element maybe bonded onto the PCB using an adhesive, die attach material, eutectic process, and/or other suitable connection process. The PCB may provide means for an electrical connection to the LED such as conductive traces operable to deliver a voltage to the LED element and/or circuitry or components associated with the LED. In an embodiment, the LED element includes a heat slug or thermal pad which is attached to the PCB.

In an embodiment, the PCB is a metal core PCB (MC-PCB). The MC-PCB may be used for high power LED applications. The MC-PCB may be a copper-type MC-PCB. In an alternative embodiment, the MC-PCB is an aluminum-type MC-PCB. In other embodiments, a PCB having FR4, and/or other suitable PCB type may be used depending on design and/or cost constraints. The MC-PCB may provide for thermal management for the LED device allowing a path for heat dissipation through the backside of the LED element.

The PCB may include a multi-layer structure. In an embodiment, the PCB is an MC-PCB that includes a multi-layer structure having a conductor layer, an insulator layer, and a base layer. The base layer may act as a heat spreader. The base layer may include metal. In an embodiment, the base layer includes copper (e.g., copper or copper alloy). In other embodiments, the base layer may be aluminum or aluminum alloy. In an embodiment, ink is disposed on a surface of the base layer, for example, disposed on the surface of the copper layer. The ink may include a solder mask that covers the electrical path and protects the copper clad isolating it from air and/or other charged bodies. The insulator layer may be a dielectric polymer or other insulating material. The insulator layer may include a composition selected for its high thermal conductivity (e.g., greater than 1 W/mK). The conductor layer provides an electrode pattern or traces that carry electrical signals (e.g., provide a voltage) to the LED element. In an embodiment, the conductor layer is copper (e.g., a copper clad).

Figure 2:
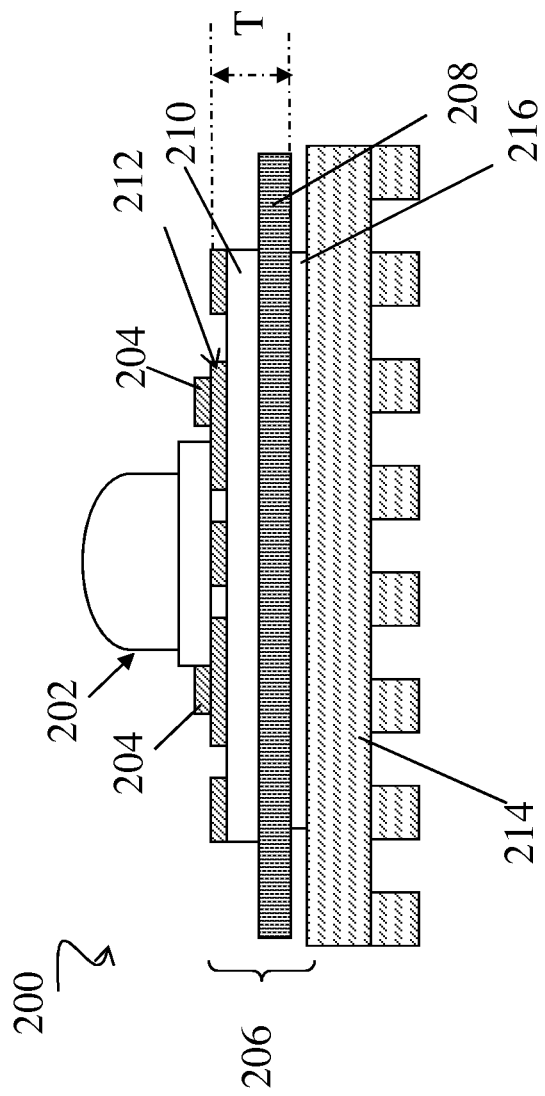
FIG. 2 is a diagrammatic cross-sectional view of an embodiment of assembling of an LED device according to the method of FIG. 1.

Referring to the example of FIG. 2, illustrated is an MC-PCB 206. The MC-PCB 206 includes a base layer 208, an interposing dielectric layer 210, and a conductor layer 212. The conductor layer 212 may provide an electrical and/or physical connection to poles 204 coupled to the LED element 202. The poles 204 may be differently biased (e.g., a +biased pole and a −biased poll). The poles 204 may be operable to provide a voltage to the LED element 202 such that the LED element 202 can operate. The poles 204 may be pads operable to provide an electrical connection by wire bonding. The poles 204 may include gold, tin, and/or other conductive material. In an embodiment, the base layer 208 is copper. In an embodiment, the interposing dielectric layer 210 is a thermally conductive dielectric. The MC-PCB 206 may have a thickness T of between approximately 0.5 mm and approximately 2 mm. FIG. 2 illustrates the LED element 202 disposed on the MC-PCB 206.

The method 100 then proceeds to block 106 where a heat sink is provided. The heat sink may provide for dissipation of heat generated by the LED element away from the LED element(s) disposed on the heat sink. In an embodiment, the heat sink is aluminum. Other exemplary compositions include copper. Referring to the example of FIG. 2, a heat sink 214 is provided. In an embodiment, the heat sink 214 is aluminum. The heat sink 214 is exemplary only and not intended to be limited in its configuration; any configuration of cooling device may be used.

The method 100 then proceeds to block 108 where an interface material is applied to at least one of the PCB and the heat sink. The interface material may be thermally conductive material. In an embodiment, the interface material is a thermally conductive gel. The interface material may have adhesion properties such that it provides a bonding between the PCB and the heat sink. Alternatively, the interface material may provide an interface for thermal conduction between the PCB and the heat sink, but does not provide any adhesive property such to bond the PCB and heat sink. Referring to the example of FIG. 2, an interface material 216 is illustrated. In an embodiment, the interface material 216 is a thermally conductive material (e.g., gel). FIG. 2 illustrates the LED element 202 and MC-PCB 206 disposed on the heat sink 214 prior to bonding the elements, which is described below.

The method 100 then proceeds to block 110 where the LED device and heat sink are bonded. In conventional methods the heat sink may be coupled to an LED device using screws and/or a thermal interface material (TIM), which is used to fill a space between the LED and heat sink. This can be a costly and inefficient process. The present disclosure provides certain embodiments with advantages over the use of screws.

In an embodiment, the PCB structure (including the LED element disposed thereon) is bonded to the heat sink using ultrasonic energy. The ultrasonic energy process (e.g., ultrasonic welding) may include the application of pressure between the PCB and the heat sink. Specifically, the ultrasonic welding process may include providing high-frequency vibrations to the PCB structure and/or the heat sink, which are being held together by an applied pressure. This may provide a solid-state bond by mixing material from the PCB and material from the heat sink. Thus, no screws or other connective means such as bolts, soldering, or adhesives may be required. The frequency of the ultrasonic process may be approximately 15 kHz, approximately 20 kHz, approximately 30 kHz, approximately 35 kHz, approximately 40 kHz or approximately 70 kHz; however, numerous other examples may be possible.

The ultrasonic bonding process includes applying a pressure to the components being bonded (e.g., PCB and heat sink). In an embodiment, the pressure is applied using a press apparatus or jig. The press apparatus may provide a pressure applied to the MC-PCB and specifically to the base layer of the MC-PCB. Alternatively, or additionally, the press apparatus may provide a pressure applied to the heat sink. In an embodiment, the bonding apparatus provides a pressure and/or ultrasonic frequency in a ring (e.g., rectangular area) around the LED element. In an embodiment, the bonding apparatus provides a pressure and/or ultrasonic frequency in a ring (rectangular region) around the edge region of the PCB (e.g., edge region of the base metal layer of the MC-PCB). In an embodiment, a bond greater than approximately 3 mm in width is formed, however numerous other embodiments are possible. The bond width may be controlled by the region of pressure and/or region of incident energy.

As described above, in an embodiment, the ultrasonic welding process (e.g., with pressure) causes the material on the MC-PCB to mix with the material of the heat sink. Specifically, it may cause the material (e.g., a metal) of the base metal layer of the MC-PCB to mix with the material (e.g., a metal) of the heat sink. In an embodiment, the bonding provides for the mixture of copper and aluminum. For example, in an embodiment, the base layer of the MC-PCB is copper and the heat sink is aluminum, which are mixed to form the bond between the elements.

In an alternative embodiment, the PCB structure is bonded to the heat sink using a thermosonic bonding process. The thermosonic bonding may form a solid-state bond. The thermosonic bond may include applying heat, ultrasonic energy, and/or pressure to one or more of the elements to be bonded. Similar to as described above, in an embodiment, the thermosonic process causes the material on the MC-PCB to mix with the material of the heat sink. Specifically, the thermosonic process may provide the material (e.g., a metal) of the base metal layer of the MC-PCB to mix with the material (e.g., a metal) of the heat sink. In an embodiment, the bonding provides for the mixture of copper and aluminum. For example, in an embodiment, the base layer of the MC-PCB is copper and the heat sink is aluminum, which are mixed to form the bond between the elements.

Figure 3:
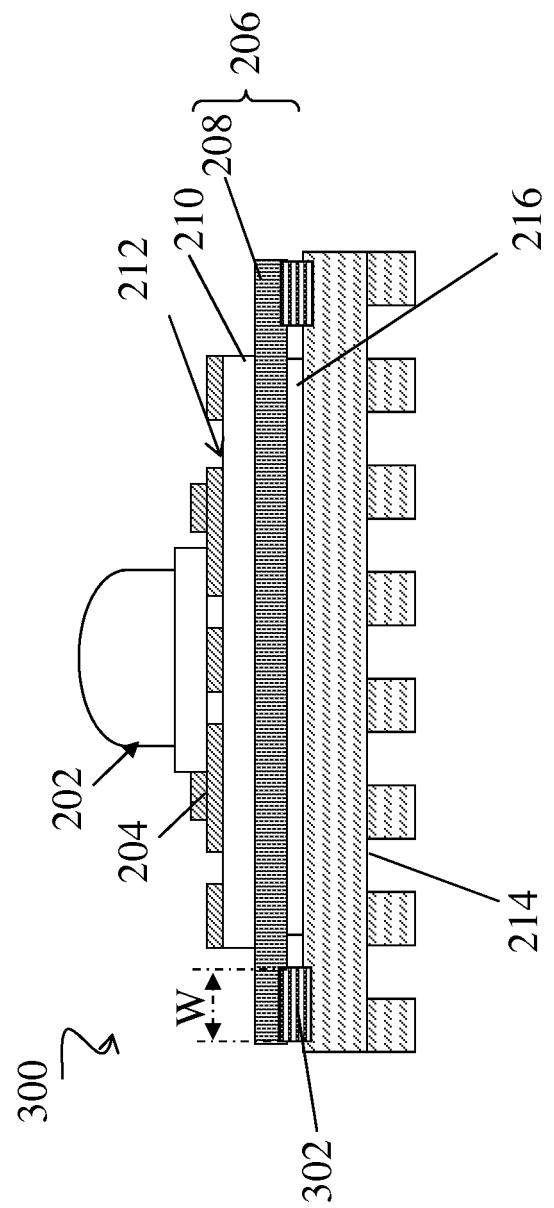
FIG. 3 is a diagrammatic cross-sectional view of an embodiment of assembling of an LED device at a subsequent process step of the method of FIG. 1.
Figure 4:
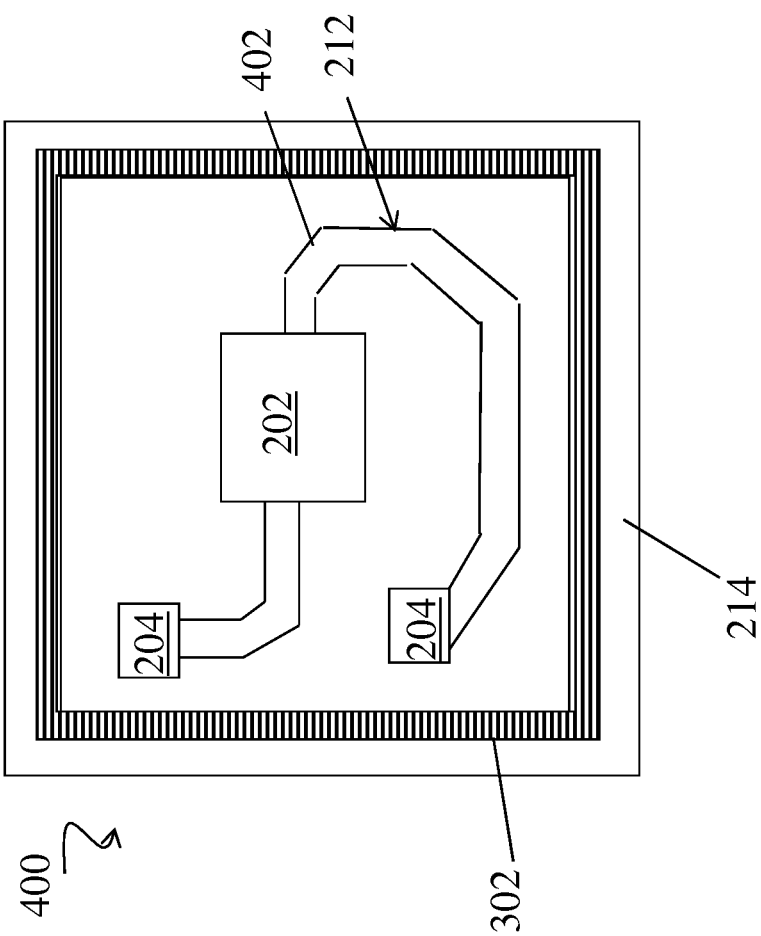
FIG. 4 is a top view of an assembled LED device corresponding to the device of FIG. 3.

Referring to the example of FIG. 3, a bonding process has been performed on the device 200, described above with reference to FIG. 2, providing the LED module 300. The LED module 300 illustrates a bond (e.g., physical connection) 302 between the base metal layer 208 and the heat sink 214. In an embodiment, the bond 302 is formed by an ultrasonic bonding process. In an embodiment, the bond 302 is formed by a thermosonic bonding process.

The bond 302 includes a mixture of materials from the base metal layer 208 and the heat sink 214 in a solid-state bond. In an embodiment, the bond 302 includes a mixture of aluminum and copper. In an embodiment, the bond has a width W of greater than approximately 3 mm. However, other widths are possible and controllable by the apparatus used to bond the elements. Based on the jig setting, a smaller contact area may be performed. The region of the base metal layer 208 adjacent and overlying the bond 302 may be an exclusion area wherein no path or trace (e.g., carrying an electrical signal) is located. For example, in an embodiment the conductor layer 212 is not disposed above the region of the bond 302. The region of the PCB 206 where the bond 302 will be formed (e.g., overlying the bond 302) may be referred to as a bonding region. The bonding region may be the edge region of the PCB (e.g., base layer 208).

The bond 302 may be a continuous ring (circular, rectangular, etc) or include a plurality of bond segments interposed by non-bonded regions. The bond segments may be disposed in a ring around an LED element. The bond 302 is illustrated as being formed on the terminal edge of the base metal layer 208, however other embodiments are possible. The bond 302 may directly bond a corner of the MC-PCB 206, for example, the base layer 208, to the heat sink 214.

Referring to FIG. 4, illustrated is a top view of an embodiment of an LED module according to the present disclosure. The LED module 400 may be substantially similar to the LED module 300, described above with reference to FIG. 3. Thus, a similar numbering scheme is employed. The LED module 400 illustrates the bond 302 formed in a continuous ring. However, other embodiments are possible. The LED module 400 includes traces 402 (e.g., an electrode pattern). The traces 402 may provide electrical connection from the poles 204 to the LED element 202. The traces 402 may be formed in the conductor layer 212 of the PCB.

Figure 5:
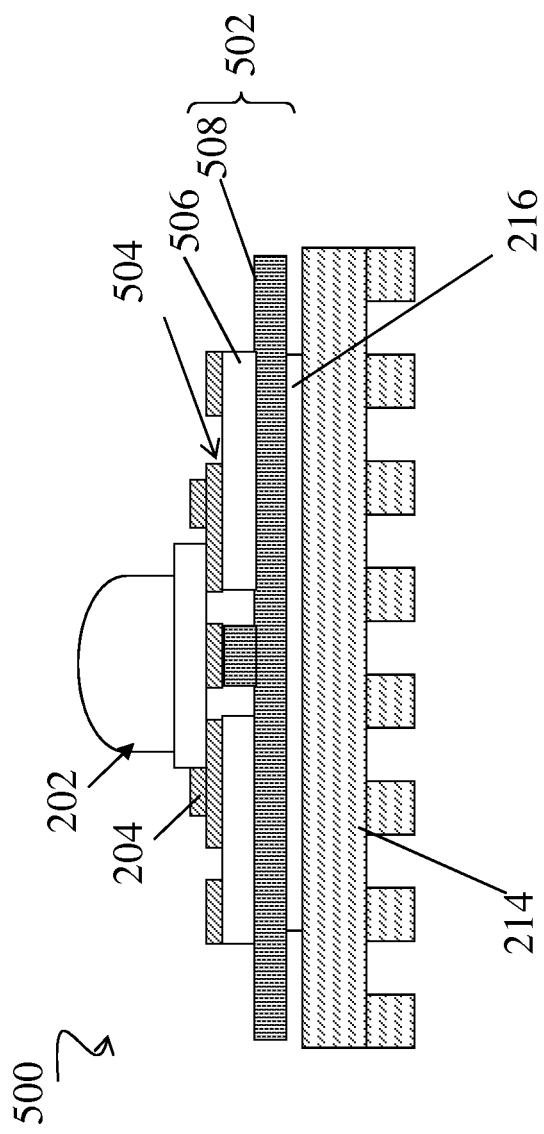
FIG. 5 is a diagrammatic cross-sectional view of another embodiment of assembling of an LED device according to the method of FIG. 1.
Figure 6:
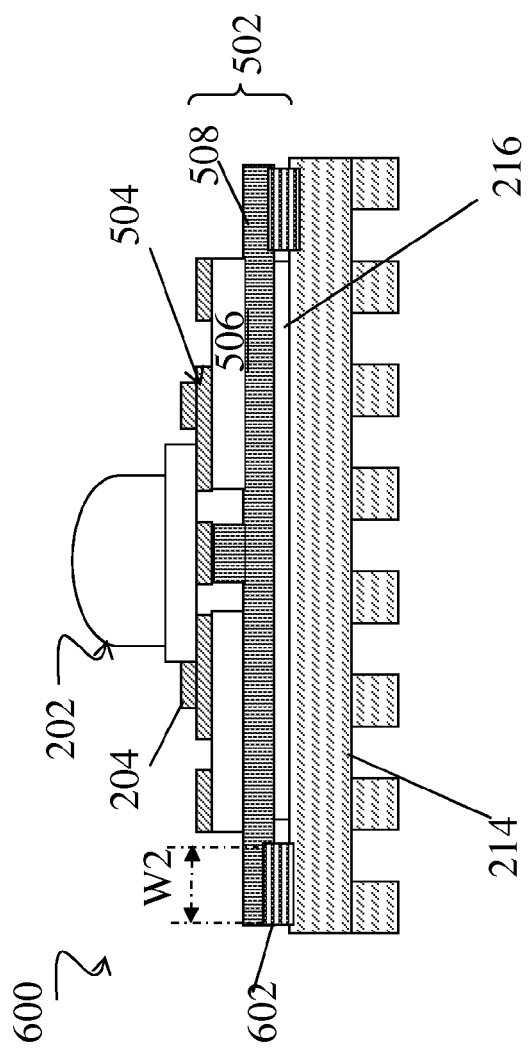
FIG. 6 is a diagrammatic cross-sectional view of the LED device embodiment of FIG. 5 at a subsequent process step of the method of FIG. 1.

Referring now to FIGS. 5 and 6, illustrated is another embodiment an LED module according to the present disclosure. FIG. 5 illustrates a device 500, which may be substantially similar to the device 200, described above with reference to FIG. 2. The device 500 includes an LED element 202, poles 204, and an MC-PCB 502 disposed on a heat sink 214. An interface layer 216 interposes the heat sink and the MC-PCB 502. In an embodiment, the device 500 illustrates an LED module before bonding the MC-PCB and the heat sink together (e.g., as illustrated in FIG. 6).

The LED element 202, the poles 204, the interface layer 216, and/or the heat sink 214 may be substantially similar to as described above with reference to FIGS. 2 and 3. The MC-PCB 502 is a multi-layer PCB. The MC-PCB 502 may be referred to as a Direct MC-PCB. The MC-PCB 502 includes a conductive layer 504, an insulating layer 506 and a base layer 508. The conductor layer 504 may provide an electrical and/or physical connection (e.g., electrode pattern) from the poles 204 to the LED element 202. The conductor layer 504 may include copper (e.g., copper clad). In an embodiment, the base layer 508 is copper. In an embodiment, the interposing insulating layer 506 is thermally conductive. The MC-PCB 502 may have a thickness T2 of between approximately 0.5 mm and approximately 2 mm. The MC-PCB 502 may different from the MC-PCB 206 in that the MC-PCB 502 does not include the insulating layer 506 on the bottom side of a portion of the LED element 202 (e.g., beneath the thermal pad of the LED element 202).

Referring now, to FIG. 6 illustrated is the device 500, described above with reference to FIG. 5, having been bonded together to form the LED module 600. The LED module 600 illustrates a bond (e.g., physical connection) 602 between the base layer 508 and the heat sink 214. The bond 602 may be formed using the method 100, including as described above with reference to block 110 of the method 100. In an embodiment, the bond 602 is formed by an ultrasonic bonding process. In an embodiment, the bond 602 is formed by a thermosonic bonding process.

The bond 602 includes a mixture of material(s) from the base layer 508 and the heat sink 214 in a solid-state bond. In an embodiment, the bond 602 includes a mixture of aluminum and copper. For example, the base layer 508 may be copper and the heat sink 214 may be aluminum, which mix to form a bond of a mixture of copper and aluminum. In an embodiment, the bond 602 has a width W2 of greater than approximately 3 mm. However, other widths are possible and controllable by the apparatus used to bond the elements. The region of the base layer 508 adjacent and overlying the bond 602 may be a bonding region that provides an exclusion area wherein no path or trace (e.g., carrying an electrical signal) is disposed thereon (e.g., the conductive layer is not disposed above the region of the bond 602).

The bond 602 may be a continuous ring or include a plurality of bond segments interposed by non-bonded regions. The bond segments may be disposed in a ring. The bond 602 is illustrated as being formed on the terminal edge of the base layer 508, however other embodiments are possible. The bond 602 may directly bond a corner of the MC-PCB 502, for example, the base layer 508 to the heat sink 214.

Though FIGS. 2, 3, 4, 5, and 6 illustrate various embodiments of LED modules and components thereof, one of ordinary skill in the art would recognize that aspects of the present disclosure may be provided to various configurations of LED module.

Thus, provided is a method of bonding an LED element coupled to a PCB and a heat sink to form an LED module. The method includes a bonding process that provides for ultrasonic bonding with pressure to bond a PCB directly to a heat sink. The bond may be a solid-state bond having a mixture of the material of the PCB and the material of the heat sink.

Specifically, in an embodiment a method of assembling an LED module is described that includes providing a light-emitting diode (LED) device (e.g., a LED element and PCB) and a heat sink. The LED device is bonded to the heat sink by applying an ultrasonic energy. In an embodiment, the bonding may forms a bond comprising copper and aluminum. In a further embodiment, the PCB is a metal core PCB (MC-PCB). The ultrasonic bonding process may include applying a pressure to at least one of the LED device and the heat sink while applying the ultrasonic energy.

In certain embodiments a thermally conductive material is applied between the LED device and the heat sink prior to the bonding. In other embodiments, the bonding further includes applying heat to at least one of the heat sink and the LED device (e.g., thermosonic bonding).

In another embodiment, a method of assembling a light-emitting diode (LED) module is described. An LED element and heat sink are provided. The LED element may be coupled to a printed circuit board (PCB). The PCB and heat sink are bonded using ultrasonic energy. The PCB may be a metal-core PCB (MC-PCB).

In an embodiment, the PCB is a multi-layer board and includes a base layer having a first composition. The heat sink may include a second composition. Bonding the LED device to the heat sink includes creating a bond comprising the first composition mixed with the second composition. In a further embodiment, the second composition is aluminum and the first composition is copper.

In embodiment of the method, bonding the PCB to the heat sink includes forming one or more bonds disposed along an edge of the PCB. The width of the bond may be greater than approximately 3 mm. The bonding of the PCB to the heat sink may include applying a pressure to a bonding region and the bond is formed in the bonding region. The method may also include forming thermally conductive gel layer interposing the PCB and the heat sink prior to bonding the heat sink and PCB.

The present disclosure also provides a light-emitting diode (LED) module. The LED module, in an embodiment, includes a heat sink having a first composition and an LED device disposed on the heat sink. The LED device includes an LED element and a metal core printed circuit board (MC-PCB). The MC-PCB includes a second composition. The module further includes a bond between the heat sink and the MC-PCB; the bond includes a mixture of the first and second compositions.

In certain embodiments, the first composition is aluminum and the second composition is copper. The bond may be disposed on an edge of the MC-PCB. The bond may form a ring surrounding the LED element.

What is claimed is:

1. A lighting apparatus, comprising:
   a thermally conductive structure that contains a first material;
   a printed circuit board disposed over the thermally conductive structure, wherein the printed circuit board includes:
      a base layer that contains a second material, wherein the thermally conductive structure and the base layer are bonded together without a connective means or an adhesive;
      a dielectric layer disposed over the base layer; and
      a conductor layer disposed over the dielectric layer; and
   a photonic device disposed over the printed circuit board.

2. The lighting apparatus of claim 1, wherein the thermally conductive structure and the base layer of the printed circuit board are bonded together through a solid-state bond structure that contains a mixture of the first material and the second material.

3. The lighting apparatus of claim 2, wherein the mixture of the first material and the second material includes a mixture of copper and aluminum.

4. The lighting apparatus of claim 2, wherein the solid-state bond structure encircles the photonic device in a top view.

5. The lighting apparatus of claim 2, wherein the solid-state bond structure has a lateral dimension that is greater than about 3 millimeters.

6. The lighting apparatus of claim 2, wherein the solid-state bond structure includes a plurality of discrete segments that are separated from one another by non-bonded regions.

7. The lighting apparatus of claim 2, further comprising: a thermally conductive interface material disposed between the thermally conductive structure and the printed circuit board.

8. The lighting apparatus of claim 7, wherein the solid-state bond structure encircles the thermally conductive interface material in a top view.

9. The lighting apparatus of claim 1, wherein the printed circuit board is a metal core printed circuit board (MCPCB).

10. The lighting apparatus of claim 1, wherein:
    the first material is a first metal; and
    the second material is a second metal different from the first metal.

11. The lighting apparatus of claim 1, wherein the dielectric layer contains a thermally conductive dielectric material.

12. The lighting apparatus of claim 1, wherein the photonic device includes a light-emitting diode (LED), and wherein the LED is electrically coupled to the conductor layer of the printed circuit board.

13. A lighting apparatus, comprising:
    a heat sink that contains a first metal;
    a metal core printed circuit board (MCPCB) disposed over the heat sink, wherein the MCPCB includes:
       a base metal layer that contains a second metal;
       a thermally conductive dielectric layer disposed over the base metal layer; and
       a conductor layer disposed over the thermally conductive dielectric layer;
    a bond structure that bonds the heat sink and the base metal layer of the MCPCB together, wherein the bond structure contains a mixture of the first metal and the second metal; and
    a light-emitting diode (LED) disposed over the conductor layer of the MCPCB, and wherein the LED is electrically coupled to the conductor layer.

14. The lighting apparatus of claim 13, wherein the mixture of the first metal and the second metal includes a mixture of copper and aluminum.

15. The lighting apparatus of claim 13, wherein the bond structure is continuous and encircles the LED in a top view.

16. The lighting apparatus of claim 13, further comprising: a thermally conductive gel disposed between the heat sink and the base metal layer, wherein the thermally conductive gel is encircled by the bond structure in a top view.

17. A method, comprising:
    providing a heat sink that contains a first metal;
    providing a metal core printed circuit board (MCPCB) that includes:
       a base metal layer that contains a second metal;
       a thermally conductive dielectric layer disposed over the base metal layer; and
       a conductor layer disposed over the thermally conductive dielectric layer; and
    bonding the heat sink with the base metal layer of the MCPCB using ultrasonic energy to create a mixture of the first metal and the second metal between the heat sink and the base metal layer.

18. The method of claim 17, further comprising: attaching a light-emitting diode (LED) to the MCPCB, wherein the LED is electrically coupled to the conductor layer of the MCPCB.

19. The method of claim 17, wherein a frequency of the ultrasonic energy is one of: about 15 kHz, about 20 kHz, about 30 kHz, about 35 kHz, about 40 kHz, or about 70 kHz.

20. The method of claim 17, further comprising: applying a pressure to the MCPCB and the heat sink during the bonding.

* * * * *